United States Patent
Nam et al.

(10) Patent No.: US 12,382,704 B2
(45) Date of Patent: Aug. 5, 2025

(54) SEMICONDUCTOR DEVICE AND ELECTRONIC APPARATUS INCLUDING THE SEMICONDUCTOR DEVICE

(71) Applicant: Samsung Electronics Co., Ltd., Suwon-si (KR)

(72) Inventors: Seunggeol Nam, Suwon-si (KR); Hyunjae Lee, Suwon-si (KR); Dukhyun Choe, Suwon-si (KR); Jinseong Heo, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 320 days.

(21) Appl. No.: 17/945,538

(22) Filed: Sep. 15, 2022

(65) Prior Publication Data

US 2023/0088827 A1 Mar. 23, 2023

(30) Foreign Application Priority Data

Sep. 17, 2021 (KR) .................. 10-2021-0125212

(51) Int. Cl.
*H10D 30/62* (2025.01)
*H10D 30/69* (2025.01)
*H10D 64/68* (2025.01)

(52) U.S. Cl.
CPC ......... *H10D 64/689* (2025.01); *H10D 30/701* (2025.01)

(58) Field of Classification Search
CPC .. H10D 64/689; H10D 30/701; H10D 64/685; H10D 64/033; H10D 30/62;
(Continued)

(56) References Cited

U.S. PATENT DOCUMENTS 6,331,325 B1 * 12/2001 Kulwicki ............... H10D 1/682
427/126.3
6,387,748 B1 * 5/2002 Agarwal ............... H10D 1/696
257/E21.01
(Continued)

FOREIGN PATENT DOCUMENTS

CN 113054023 A 6/2021
EP 3846232 A2 7/2021
(Continued)

OTHER PUBLICATIONS

Extended European Search Report dated Feb. 2, 2023 issued in European Patent Application No. 22196109.7-1212.
(Continued)

*Primary Examiner* — Sheikh Maruf
(74) *Attorney, Agent, or Firm* — Harness, Dickey & Pierce, P.L.C.

(57) ABSTRACT

A semiconductor device includes: a first source/drain region; a second source/drain region; a channel between the first source/drain region and the second source/drain region; an interfacial insulating layer on the channel; a ferroelectric layer on the interfacial insulating layer; and a gate electrode on the ferroelectric layer, wherein, when a numerical value of dielectric constant of the interfacial insulating layer is K and a numerical value of remnant polarization of the ferroelectric layer is Pr, a material of the interfacial insulating layer and a material of the ferroelectric layer are selected so that K/Pr is 1 or more.

26 Claims, 16 Drawing Sheets

(58) Field of Classification Search
CPC ............ H10D 30/6735; H10D 64/681; H10D 64/691; H10B 51/30; H01L 29/516; H01L 29/78391; H01L 29/513; H01L 29/40111
USPC ........................................................ 257/295
See application file for complete search history.

(56) References Cited

U.S. PATENT DOCUMENTS

| | | | |
|---|---|---|---|
| 6,515,322 B1 | 2/2003 | Watanabe | |
| 10,804,294 B2 | 10/2020 | Yoo | |
| 2002/0003280 A1* | 1/2002 | Kohyama | H10B 12/09 257/E21.018 |
| 2002/0025625 A1* | 2/2002 | Agarwal | H01L 21/76862 257/E21.009 |
| 2004/0233610 A1* | 11/2004 | Basceri | H10D 1/684 361/306.3 |
| 2005/0002227 A1* | 1/2005 | Hideki | H10N 70/8828 365/163 |
| 2005/0090069 A1* | 4/2005 | Miller | H10B 12/03 257/E21.011 |
| 2014/0212576 A1* | 7/2014 | Fujii | H01B 3/12 427/79 |
| 2018/0240803 A1* | 8/2018 | Yoo | H01L 29/517 |
| 2019/0244973 A1* | 8/2019 | Yoo | H01L 21/22 |
| 2019/0267383 A1* | 8/2019 | Rocklein | H10B 12/318 |
| 2019/0288116 A1 | 9/2019 | Yoo | |
| 2019/0355584 A1* | 11/2019 | Yamaguchi | G11C 11/2275 |
| 2020/0321445 A1* | 10/2020 | Then | H01L 29/7786 |
| 2021/0050340 A1* | 2/2021 | Abessolo Bidzo | H01L 27/0255 |
| 2021/0098595 A1* | 4/2021 | Lee | H01L 28/56 |
| 2021/0143250 A1* | 5/2021 | Lee | H01L 28/60 |
| 2021/0151552 A1* | 5/2021 | Lee | H10N 70/841 |
| 2021/0183889 A1* | 6/2021 | Chia | H01L 29/516 |
| 2021/0249515 A1* | 8/2021 | Yamaguchi | G11C 11/223 |
| 2021/0305397 A1* | 9/2021 | Vellianitis | H01L 29/78391 |
| 2021/0367080 A1* | 11/2021 | Lee | H01L 29/6684 |

FOREIGN PATENT DOCUMENTS

| | | |
|---|---|---|
| JP | 2014-099517 A | 5/2014 |
| KR | 10-0247884 B1 | 3/2000 |
| KR | 10-2019-0109606 A | 9/2019 |

OTHER PUBLICATIONS

J. Muller, et al. "Ferroelectricity in HfO2 enables nonvolatile data storage in 28 nm HKMG," Symposium on VLSI Technical Papers, IEEE, pp. 25-26 (2012).

Sharma, et al. "High Speed Memory Operation in Channel-Last, Back-gated Ferroelectric Transistors," IEEE, 18.5.1-18.5.4 (2020).

* cited by examiner

SEMICONDUCTOR DEVICE AND ELECTRONIC APPARATUS INCLUDING THE SEMICONDUCTOR DEVICE

CROSS-REFERENCE TO RELATED APPLICATION

This application is based on and claims priority under 35 U.S.C. § 119 to Korean Patent Application No. 10-2021-0125212, filed on Sep. 17, 2021, in the Korean Intellectual Property Office, the disclosure of which is incorporated by reference herein in its entirety.

BACKGROUND

Some example embodiments relate to semiconductor devices and/or electronic apparatuses including the same, and more particularly, to semiconductor devices in which a dielectric constant of an interfacial insulating layer and a remnant polarization of a ferroelectric layer are combined to reduce the intensity of an electric field applied to the interfacial insulating layer, and/or to electronic apparatuses including the semiconductor devices.

Ferroelectrics are materials having ferroelectricity, for example, they maintain a spontaneous polarization by aligning internal electric dipole moments even when no electric field is applied thereto from the outside. Ferroelectrics are materials in which the polarization (and/or electric field) remains semi-permanent in the material even when a voltage is brought back to 0V after applying thereto a certain voltage. Research on applying ferroelectric properties to logic devices and/or memory devices have been conducted.

SUMMARY

Provided are semiconductor devices in which the dielectric constant of an interfacial insulating layer and a remnant polarization of a ferroelectric layer are combined to reduce the intensity of an electric field applied to the interfacial insulating layer, and/or an electronic apparatuses including the same.

Alternatively or additionally, provided are semiconductor devices with reduced operating voltage and/or electronic apparatuses including the semiconductor devices.

Alternatively or additionally, provided are semiconductor devices with improved durability and data retention, and/or electronic apparatuses including the same.

Additional aspects will be set forth in part in the description which follows and, in part, will be apparent from the description, or may be learned by practice of various example embodiments of the disclosure.

According to an some example embodiment, a semiconductor device includes: a first source/drain region; a second source/drain region; a channel between the first source/drain region and the second source/drain region; an interfacial insulating layer on the channel; a ferroelectric layer on the interfacial insulating layer; and a gate electrode on the ferroelectric layer. A material of the interfacial insulating layer and a material of the ferroelectric layer may be selected so that K/Pr is 1 or more, where K is a (unitless) numerical value of a dielectric constant of the interfacial insulating layer, and Pr is a numerical value of the remnant polarization of the ferroelectric layer, where Pr is in the units of microcoulombs per square centimeter ($uC/cm^2$).

The dielectric constant of the interfacial insulating layer and the remnant polarization of the ferroelectric layer may be selected so that a voltage applied to the interfacial insulating layer during application of an operating voltage to the gate electrode is less than a breakdown voltage of the interfacial insulating layer.

For example, the dielectric constant of the interfacial insulating layer may be 22 or more, and the remnant polarization of the ferroelectric layer may be greater than or equal to 0.1 $uC/cm^2$ and less than or equal to 15 $uC/cm^2$.

For example, the dielectric constant of the interfacial insulating layer may be 14 or more, and the remnant polarization of the ferroelectric layer may be greater than or equal to 0.1 $uC/cm^2$ and less than or equal to 10 $uC/cm^2$.

For example, the dielectric constant of the interfacial insulating layer may be 7 or more, and the remnant polarization of the ferroelectric layer may be greater than or equal to 0.1 $uC/cm^2$ and less than or equal to 5 $uC/cm^2$.

For example, a coercive field of the ferroelectric layer may be in a range from about 30 kV/cm to about 3 MV/cm or less.

For example, the interfacial insulating layer may include at least one material selected from the group including or consisting of $M-Si_xGe_{1-x}-O$ ($0 \leq x \leq 1$) and $M-Si_xGe_{1-x}-O_yN_{1-y}$ ($0 \leq x \leq 1$, $0 \leq y \leq 1$), where M includes a metal material.

For example, the metal material may include at least one material selected from the group including Ti, Al, Hf, Zr, La, Y, Mg, and Be or a combination thereof.

For example, the ferroelectric layer may include an oxide of Si, Al, Hf, or Zr such as one or more of silicon oxide, aluminum oxide, hafnium oxide, or zirconium oxide, or may include a two-dimensional ferroelectric material.

The ferroelectric layer may further include a dopant doped in the oxide or the two-dimensional ferroelectric material, wherein the dopant includes at least one material selected from the group including Si, Al, Y, La, Gd, Mg, Ca, Sr Ba, Ti, Zr, Hf and N.

The ferroelectric layer may include at least two dopants different from each other.

A ratio of the dopant in the ferroelectric layer may be in a range from about 0 at % to about 90 at %.

For example, the two-dimensional ferroelectric material may include at least one material selected from the group including $1T-MoS_2$, SnTe, GeSe, $1T-MoTe_2$, $In_2Se_3$, and $CuInP_2S_6$.

The semiconductor device may further include a conductor layer between the interfacial insulating layer and the ferroelectric layer.

A sum of an area of the interfacial insulating layer in contact with the conductor layer and an area of the conductor layer in contact with the interfacial insulating layer may be greater than a sum of an area of the ferroelectric layer in contact with the gate electrode and an area of the gate electrode in contact with the ferroelectric layer.

The semiconductor device may further include a substrate, wherein the channel may be disposed to protrude from an upper surface of the substrate and may have a shape extending in a first direction.

The interfacial insulating layer may be disposed to surround side surfaces and an upper surface of the channel, the ferroelectric layer may be disposed to surround side surfaces and an upper surface of the interfacial insulating layer, and the gate electrode may be disposed to surround side surfaces and an upper surface of the ferroelectric layer.

The channel may be disposed to be separated from the upper surface of the substrate and may extend in a first direction.

The channel may include a plurality of channel elements disposed at a distance from each other in a second direction that is different from the first direction.

The interfacial insulating layer may include a plurality of interfacial insulating layers disposed to respectively surround the plurality of channel elements, the ferroelectric layer may include a plurality of ferroelectric layers disposed to respectively surround the plurality of interfacial insulating layers, and the gate electrode may be disposed to protrude from the upper surface of the substrate to surround the plurality of ferroelectric layers.

According to some example embodiments, a semiconductor device includes: a first source/drain region; a second source/drain region; a channel between the first source/drain region and the second source/drain region; an interfacial insulating layer on the channel; a ferroelectric layer on the interfacial insulating layer; and a gate electrode on the ferroelectric layer, wherein the interfacial insulating layer may include at least one material selected from the group including $M\text{-}Si_xGe_{1-x}\text{—}O$ ($0 \le x \le 1$) and $M\text{-}Si_xGe_{1-x}\text{—}O_yN_{1-y}$ ($0 \le x \le 1$, $0 \le y \le 1$), where M includes a metal material, and a coercive field of the ferroelectric layer may be in a range from about 30 kV/cm to about 3 MV/cm or less.

According to some example embodiments, an electronic apparatus includes at least one semiconductor device, wherein each semiconductor device includes: a first source/drain region; a second source/drain region; a channel between the first source/drain region and the second source/drain region; an interfacial insulating layer on the channel; a ferroelectric layer on the interfacial insulating layer; and a gate electrode on the ferroelectric layer, wherein a material of the interfacial insulating layer and a material of the ferroelectric layer are such that K/Pr is 1 or more, where K is a numerical value of dielectric constant of the interfacial insulating layer and Pr is a numerical value of remnant polarization of the ferroelectric layer in units of $uC/cm^2$.

According to some example embodiments, a semiconductor device includes substrate including a channel region; an interfacial insulating layer on the channel region; and a ferroelectric layer directly on the interfacial insulating layer. A first material of the interfacial insulating layer and a second material of the ferroelectric layer are such that K/Pr is 1 or more, where K is a numerical value of dielectric constant of the interfacial insulating layer and PR is a numerical value in $uC/cm^2$ of a remnant polarization of the ferroelectric layer.

The semiconductor device may additionally include a gate electrode directly on the ferroelectric layer.

The dielectric constant of the interfacial insulating layer and the remnant polarization of the ferroelectric layer are such that a voltage applied to the interfacial insulating layer during application of an operating voltage to the gate electrode is less than a breakdown voltage of the interfacial insulating layer.

A thickness of the interfacial insulating layer is less than about 2 nm.

A thickness of the ferroelectric layer is less than about 20 nm.

BRIEF DESCRIPTION OF THE DRAWINGS

The above and other aspects, features, and/or advantages of certain embodiments of the disclosure will be more apparent from the following description taken in conjunction with the accompanying drawings, in which.

DETAILED DESCRIPTION OF VARIOUS EXAMPLE EMBODIMENTS

Figure 1:
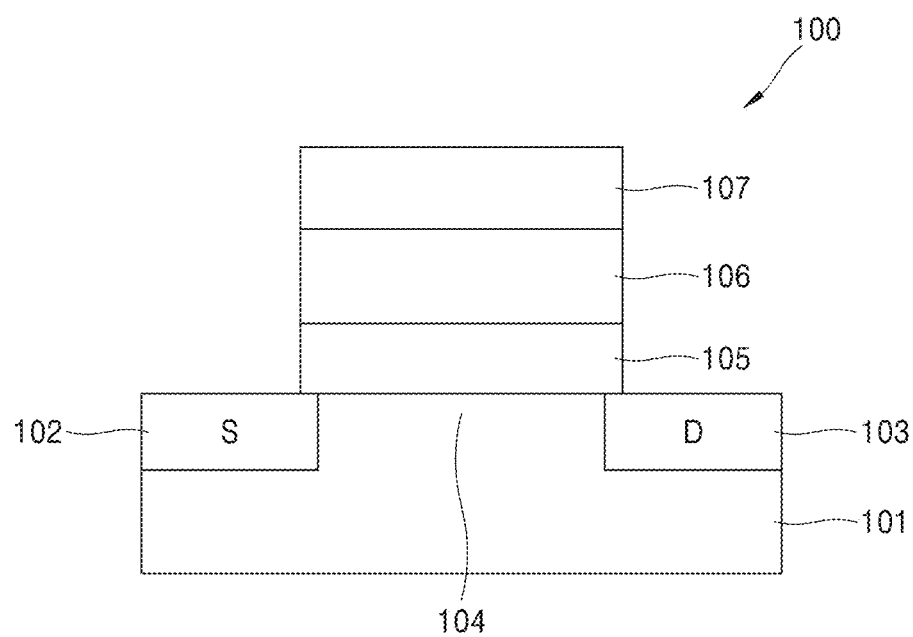
FIG. 1 is a schematic cross-sectional view illustrating a structure of a semiconductor device according to some example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, various embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a semiconductor device and/or an electronic apparatus including the same will be described in detail with reference to the accompanying drawings. In the drawings, like reference numerals refer to like elements, and the size of each component may be exaggerated for clarity and convenience of explanation. Also, example embodiments of inventive concepts are capable of various modifications and may be embodied in many different forms.

When an element or layer is referred to as being "on" or "above" another element or layer, the element or layer may be directly on another element or layer or intervening elements or layers. The singular forms are intended to include the plural forms as well unless the context clearly indicates otherwise. When a part "comprises" or "includes" an element in the specification, unless otherwise defined, it does not necessarily exclude other elements but may or may not further include other elements.

The term "above" and similar directional terms may be applied to both singular and plural. With respect to operations that constitute a method, the operations may be performed in any appropriate sequence unless the sequence of operations is clearly described or unless the context clearly indicates otherwise.

Also, in the specification, the term "units" or " . . . modules" denote units or modules that process at least one function or operation, and may be realized by hardware, software, or a combination of hardware and software.

Connections or connection members of lines between components shown in the drawings illustrate functional connections and/or physical or circuit connections, and the connections or connection members may be represented by replaceable or additional various functional connections, physical connections, or circuit connections in an actual apparatus.

The use of all examples or example terms is merely for describing the technical scope of the inventive concept in detail, and thus, the scope of the inventive concept is not limited by the examples or the example terms as long as it is not defined by the claims.

FIG. 1 is a schematic cross-sectional view illustrating a structure of a semiconductor device 100 according to some example embodiments. Referring to FIG. 1, the semiconductor device 100 according to some example embodiments includes a first source/drain region 102 (e.g. a source region), a second source/drain region 103 (e.g. a drain region), a channel 104 disposed between the first source/drain region 102 and the second source/drain region 103, an interfacial insulating layer 105 disposed to cover an upper surface of the channel 104, a ferroelectric layer 106 disposed to cover an upper surface of the interfacial insulating layer 105, and a gate electrode 107 disposed to cover an upper surface of the ferroelectric layer 106. In addition, the semiconductor device 100 may further include a substrate 101. The first source/drain region 102 and the second source/drain region 103 may be disposed on two sides of an upper surface of the substrate 101. The channel 104 may be a portion of the substrate 101.

Although not shown, the semiconductor device 100 may further include source/drain contacts/electrodes respectively disposed on the first source/drain region 102 and the second source/drain region 103. In addition, between the first source/drain region 102 and the source/drain electrode and between the second source/drain region 103 and the source/drain electrode, additional functional layers may further be disposed to reduce a contact resistance and/or to prevent or reduce the likelihood of and/or the impact from metal diffusion between a semiconductor and a metal.

The first source/drain region 102 and the second source/drain region 103 may be doped to a first conductivity type, and the channel 104 and/or the substrate 101 may be doped to a second conductivity type that is electrically opposite to the first conductivity type. For example, the substrate 101 or the channel 104 may include a p-type semiconductor and the first source/drain region 102 and the second source/drain region 103 may include an n-type semiconductor, or the substrate 101 or the channel 104 may include an n-type semiconductor and the first source/drain region 102 and the second source/drain region 103 may include a p-type semiconductor. The substrate 101 or the channel 104 may be doped at a relatively low concentration in a range of about $10^{14}/cm^3$ to about $10^{18}/cm^3$ while the first source/drain region 102 and the second source/drain region 103 may be doped at a relatively high concentration in a range of about $10^{19}/cm^3$ to about $10^{21}/cm^3$ for low resistance; however, example embodiments are not limited thereto. The first source/drain region 102 and the second source/drain region 103 may be respectively formed by doping both sides of an upper surface of the substrate 101. An upper region of the substrate 101 in which the first source/drain region 102 and the second source/drain region 103 are not formed is or corresponds to the channel 104. Accordingly, the channel 104 may be disposed between the first source/drain region 102 and the second source/drain region 103.

The substrate 101, the first source/drain region 102, and the second source/drain region 103 may include at least one of, for example, a Group IV semiconductor, such as one or more of silicon (Si), germanium (Ge), SiGe, etc., a Group III-V compound semiconductor, such as one or more of GaAs, GaP, etc., a Group II-VI compound semiconductor, an oxide semiconductor, and a two-dimensional material semiconductor. When the substrate 101, the first source/drain region 102, and the second source/drain region 103 include one or more of Si, Ge, SiGe, etc., the substrate 101 or channel 104 may be doped with at least one dopant among B, Al, Ga, and In, and the first source/drain region 102 and the second source/drain region 103 may be doped with at least one dopant among P, As, and Sb. Then, the semiconductor device 100 is or corresponds to or includes an n-channel metal oxide semiconductor field effect transistor (NMOS). Alternatively, the substrate 101 or channel 104 may be doped with at least one dopant among P, As, and Sb, and the first source/drain region 102 and the second source/drain region 103 may be doped with at least one dopant among B, Al, Ga, and In. Then, the semiconductor device 100 is or corresponds to or includes a p-channel metal oxide semiconductor field effect transistor (PMOS).

The gate electrode 107 may have a conductivity of about 1 Mohm/square or less. The gate electrode 107 may include one or more selected from the group consisting of or including metal, metal nitride, metal carbide, polysilicon such as doped polysilicon, and combinations thereof. For example, the metal may include aluminum (Al), tungsten (W), molybdenum (Mo), titanium (Ti), or tantalum (Ta), and the metal nitride film may include a titanium nitride film (TiN film) or a tantalum nitride film (TaN film), and the metal carbide may be metal carbide doped (or including) aluminum or silicon, and specific examples may include one or more of TiAlC, TaAlC, TiSiC and TaSiC. The gate electrode 107 may have a structure in which a plurality of materials are stacked. For example, the gate electrode 107 may have a stacked structure of a metal nitride layer/metal layer, such as TiN/Al, or a stacked structure of a metal nitride layer/metal carbide layer/metal layer, such as TiN/TiAlC/W. The gate electrode 107 may include a titanium nitride film (TiN) or molybdenum (Mo), and the above example may be used in variously modified forms. Alternatively or additionally, the gate electrode 107 may include a conductive two-dimensional material in addition to the materials described above. For example, the conductive two-dimensional material may include at least one of graphene, black phosphorus, amorphous boron nitride, two-dimensional hexagonal nitride boron (h-BN), and phosphorene.

The ferroelectric layer 106 may include a ferroelectric material. A ferroelectric or ferroelectric material is a material having a ferroelectricity that maintains spontaneous polarization by aligning internal electric dipole moments even when no electric field is applied from the outside. A threshold voltage of the semiconductor device 100 may be changed according to a polarization direction of the ferroelectric layer 106, for example, a direction from the gate electrode 107 to the channel 104 or vice versa from the channel 104 to the gate electrode 107. In this regard, the semiconductor device 100 may be a ferroelectric field effect transistor (FeFET). The semiconductor device 100 may be applied to, for example, a non-volatile memory device and/or a logic device.

The polarization direction of the ferroelectric layer 106 may be changed by applying an electric field greater than or equal to a coercive field to the ferroelectric layer 106. When a voltage is applied to the gate electrode 107 to change the polarization direction of the ferroelectric layer 106, an electric field is applied to the ferroelectric layer 106 and the interfacial insulating layer 105, respectively. A ratio of an electric field applied to the ferroelectric layer 106 to an electric field applied to the interfacial insulating layer 105 may be determined by a ratio of dielectric constant of the ferroelectric layer 106 to the dielectric constant of the interfacial insulating layer 105 and the intensity of remnant polarization of the ferroelectric layer 106.

According to some example embodiments, in order to increase the ratio of the electric field applied to the ferroelectric layer 106 and/or decrease the ratio of the electric field applied to the interfacial insulating layer 105, an appropriate combination of the dielectric constant of the interfacial insulating layer 105 and the remnant polarization of the ferroelectric layer 106 is provided. For example, the polarization change of the ferroelectric layer 106 may be calculated by using the Landau Khalatnikov equation based on parameters, such as an initial gate voltage and the polarization of the ferroelectric layer 106, and based on the calculation result, the change in electric field applied to the interfacial insulating layer 105 may be calculated by using Maxwell's equations. Computational simulation may be performed by repeating the above calculations until the polarization of the ferroelectric layer 106, the electric field applied to the ferroelectric layer 106, and the electric field applied to the interfacial insulating layer 105 reach an equilibrium state.

Figure 2:
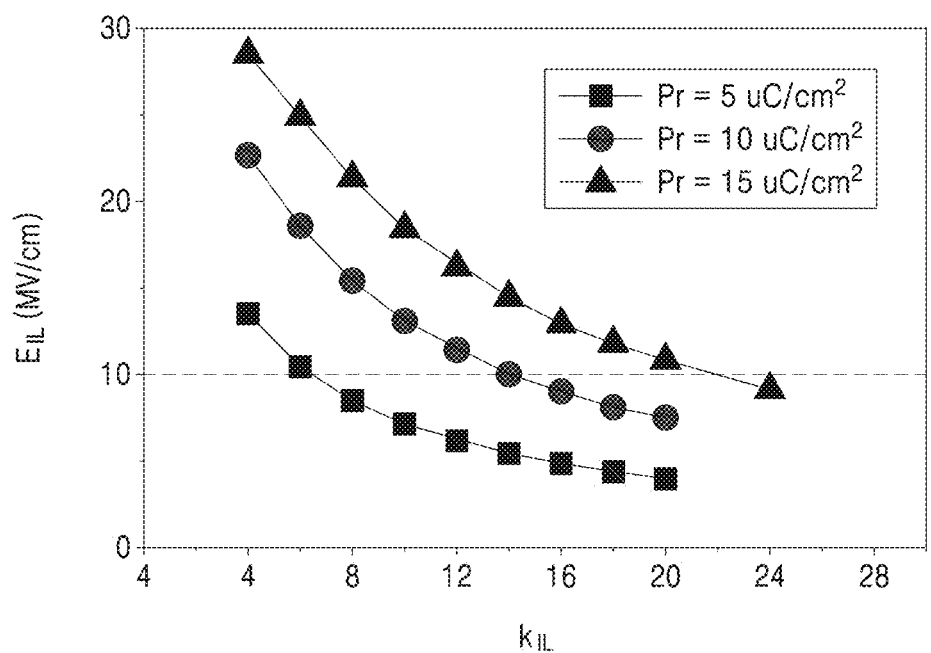
FIG. 2 is a graph showing a relationship between a combination of a dielectric constant of an interfacial insulating layer and a remnant polarization of a ferroelectric layer and an intensity of an electric field applied to the interfacial insulating layer.

FIG. 2 is a graph showing a relationship between a combination of the dielectric constant $k_{IL}$ of the interfacial insulating layer 105 and the remnant polarization Pr of the ferroelectric layer 106 and the intensity of an electric field $E_{IL}$ applied to the interfacial insulating layer 105. Unless otherwise specified, as used herein the dielectric constant $k_{IL}$ is unitless, the remnant polarization Pr has units of microcoulombs per square centimeter, and the electric field $E_{IL}$ has units of megavolts per centimeter. In the graph of FIG. 2, the horizontal axis indicates the dielectric constant $k_{IL}$ of the interfacial insulating layer 105 and the vertical axis indicates the electric field $E_{IL}$ applied to the interfacial insulating layer 105. Referring to FIG. 2, as the dielectric constant of the interfacial insulating layer 105 increases, the intensity of the electric field applied to the interfacial insulating layer 105 may decrease. Also, as the intensity of the remnant polarization of the ferroelectric layer 106 decreases, the intensity of the electric field applied to the interfacial insulating layer 105 may decrease. The dielectric constant of the interfacial insulating layer 105 and the remnant polarization of the ferroelectric layer 106 may be selected so that a voltage less than a breakdown voltage of the interfacial insulating layer 105 is applied to the interfacial insulating layer 105 while an operating voltage is applied to the gate electrode 107.

For example, the dielectric constant of the interfacial insulating layer 105 and the remnant polarization of the ferroelectric layer 106 may be selected so that an electric field of 10 MV/m or less is applied to the interfacial insulating layer 105. Referring to FIG. 2, when the remnant polarization of the ferroelectric layer 106 is 0.1 uC/cm$^2$ or more and 5 uC/cm$^2$ or less, the dielectric constant of the interfacial insulating layer 105 may be about 7 or more. Alternatively or additionally, when the remnant polarization of the ferroelectric layer 106 is 0.1 uC/cm$^2$ or more and 10 uC/cm$^2$ or less, the dielectric constant of the interfacial insulating layer 105 may be about 14 or more. Alternatively or additionally, the remnant polarization of the ferroelectric layer 106 is 0.1 uC/cm$^2$ or more and 15 uC/cm$^2$ or less, the dielectric constant of the interfacial insulating layer 105 may be about 22 or more. Therefore, if more generalized, when the numerical value of the dielectric constant of the interfacial insulating layer 105 is K and unitless, and the numerical value of the remnant polarization of the ferroelectric layer 106 is Pr in units of uC/cm$^2$, materials of the interfacial insulating layer 105 and the ferroelectric layer 106 may be selected so that K/Pr is about 1 or more. Here, Pr represents a numerical value when the unit of remnant polarization is set to uC/cm$^2$. In addition, the dielectric constant represents a relative permittivity, and K is a dimensionless numerical value. The remnant polarization of the ferroelectric layer 106 may correspond to remnant polarization of the semiconductor device 100. Therefore, the remnant polarization of the ferroelectric layer 106 may be estimated by measuring the remnant polarization of the semiconductor device 100. The dielectric constant of the interfacial insulating layer 105 may be estimated from the composition of the interfacial insulating layer 105.

The above-described numerical values relating to the breakdown voltage of the interfacial insulating layer 105, the remnant polarization of the ferroelectric layer 106, and the dielectric constant of the interfacial insulating layer 105 are merely examples. The breakdown voltage of the interfacial insulating layer 105 may vary depending on the material of the interfacial insulating layer 105 and/or of various defects in the material of the interfacial insulating layer 105. In addition, the remnant polarization of the ferroelectric layer 106 and the dielectric constant of the interfacial insulating layer 105 may also vary according to a change in the breakdown voltage. However, no matter what materials are selected as the materials of the interfacial insulating layer 105 and the ferroelectric layer 106, the overall tendency shown in the graph of FIG. 2 may be maintained.

An insulating dielectric material of the interfacial insulating layer 105 satisfying the dielectric constant condition described above may include at least one material selected from, for example, metal-silicon-oxide, metal-silicon-nitride, metal-silicon-oxynitride, metal-germanium-oxide, metal-germanium-oxynitride, metal-silicon-germanium-oxide, metal-silicon-germanium-nitride, and metal-silicon-germanium-oxynitride. In other words, the interfacial insulating layer 105 may include at least one material selected from M-Si$_x$Ge$_{1-x}$—O (0≤x≤1) and M-Si$_x$Ge$_{1-x}$—O$_y$N$_{1-y}$ (0≤x≤1, 0≤y≤1). Here, M represents a metal material. The metal material may include, for example, at least one material selected from Ti, Al, Hf, Zr, La, Y, Mg, and Be, or a combination thereof. When the channel 104 includes silicon, the interfacial insulating layer 105 may also include silicon, and when the channel 104 includes germanium, the interfacial insulating layer 105 may also include germanium.

Figure 3:
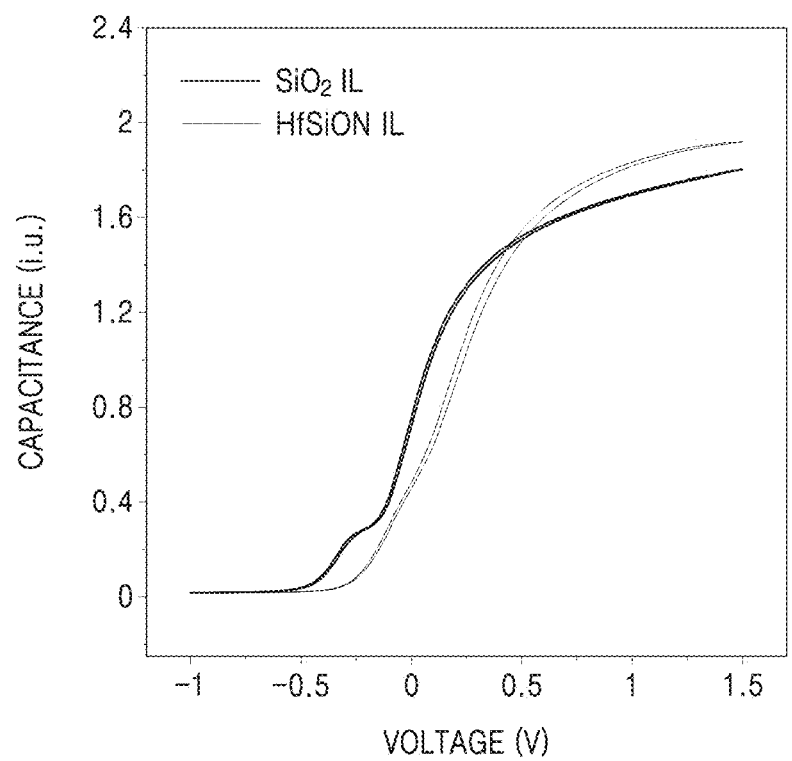
FIG. 3 is a graph showing a comparison of a capacitance-voltage characteristic of two semiconductor devices including interfacial insulating layers having different dielectric constant.

FIG. 3 is a graph showing a comparison of a capacitance-voltage characteristic of two semiconductor devices including interfacial insulating layers 105 having different dielectric constant. For example, the interfacial insulating layer 105 of the semiconductor device 100 according to various example embodiments includes HfSiON, and the interfacial insulating layer of the semiconductor device according to a comparative example includes SiO$_2$ but may not include HfSiON. The capacitance represents a measured capacitance of a capacitor formed between the gate electrode 107 and the channel 104, and the voltage represents a gate voltage. Referring to the graph of FIG. 3, because the dielectric constant of HfSiON is greater than that of SiO$_2$, when an operating voltage is applied to the gate electrode 107, it may be seen that the capacitance of the semiconductor device 100 according to various embodiments is greater than that of the semiconductor device according to the comparative example.

Figure 4:
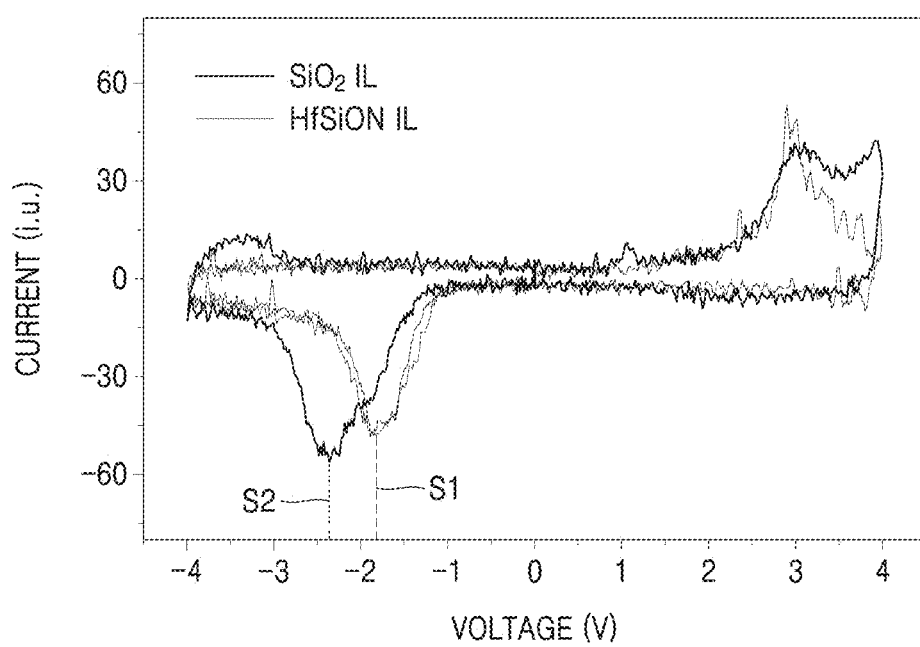
FIG. 4 is a graph showing a comparison of switching voltages of two semiconductor devices each including interfacial insulating layers having different dielectric constants from each other.

FIG. 4 is a graph showing a comparison of switching voltages of two semiconductor devices each including an interfacial insulating layer 105 and having dielectric constants different from each other. In the graph of FIG. 4, the current represents a displacement current between the gate electrode 107 and the substrate 101. Because the dielectric constant of HfSiON is greater than that of SiO$_2$, when the same voltage is applied to the gate electrode, an electric field applied to the ferroelectric layer 106 of the semiconductor device 100 according to the embodiment is greater than an electric field applied to the ferroelectric layer of the semiconductor device according to the comparative example. Accordingly, as it may be seen from the graph of FIG. 4, a switching voltage S1 of the semiconductor device 100 according to the embodiment may be less than a switching voltage S2 of the semiconductor device according to the comparative example. Accordingly, the operating voltage of the semiconductor device 100 according to various example embodiments may be reduced.

The remnant polarization of the ferroelectric layer 106 may be determined by one or more of a type of material of the ferroelectric layer 106, a type of dopant, a ratio of the dopant, an orientation, and the like. For example, the ferroelectric layer 106 may include one or more oxides of one or more of Si, Al, Hf, and Zr, and/or a two-dimensional ferroelectric material. In addition, the two-dimensional ferroelectric material may include at least one material selected from 1T-MoS$_2$, SnTe, GeSe, 1T-MoTe$_2$, In$_2$Se$_3$, and CuInP$_2$S$_6$. The ferroelectric layer 106 may be configured so that the intensity of the remnant polarization is, for example, 15 uC/cm$^2$ or less, 10 uC/cm$^2$ or less, or 5 uC/cm$^2$ or less.

Alternatively or additionally, the ferroelectric layer 106 may be configured to have a coercive field in a range of 30 kV/cm to 3 MV/cm or less.

In order to control the remnant polarization and the coercive field, the ferroelectric layer 106 may further include a dopant doped in the oxide described above or in a two-dimensional ferroelectric material. For example, the dopant may include at least one material selected from Si, Al, Y, La, Gd, Mg, Ca, Sr, Ba, Ti, Zr, Hf, and N. Alternatively or additionally, the ferroelectric layer 106 may include at least two dopants different from each other. The remnant polarization and coercive field of the ferroelectric layer 106 may vary depending on a ratio of dopants in the ferroelectric layer 106.

Figure 5:
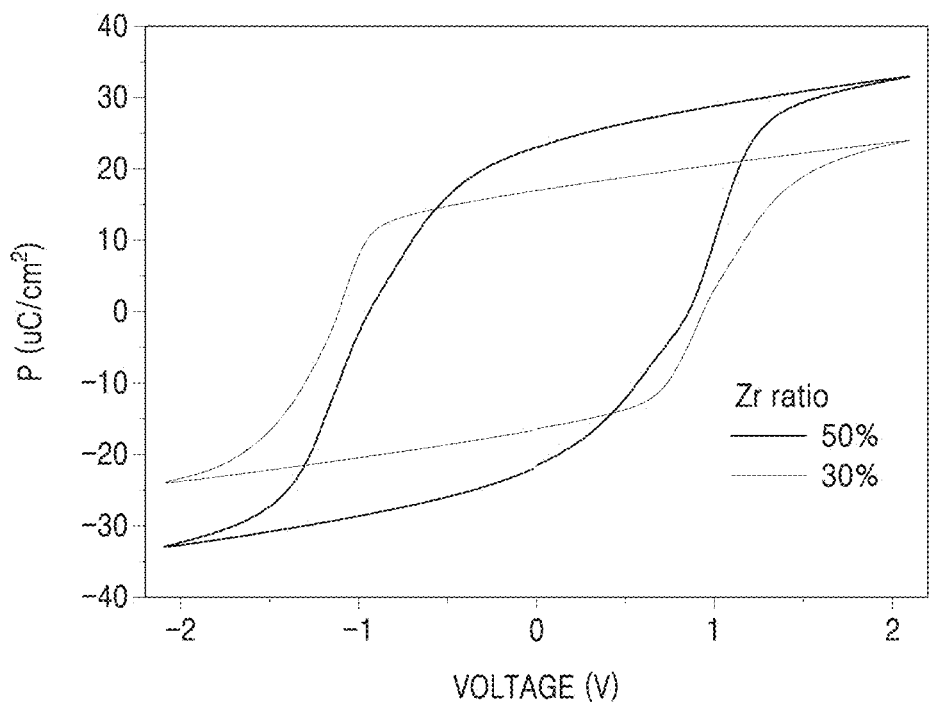
FIG. 5 is a graph showing a comparison of remnant polarizations of two ferroelectric layers having different doping concentrations from each other.

FIG. 5 is a graph showing a comparison of remnant polarizations of two ferroelectric layers 106 having different doping concentrations from each other. HfO$_2$ is used as a material of the ferroelectric layer 106 and Zr is used as a dopant. Referring to the graph of FIG. 5, when a ratio of Zr is 50 at % (indicated by a thick solid line), the remnant polarization of the ferroelectric layer 106 is about 22 uC/cm$^2$. Further, when the ratio of Zr is 30 at % (indicated by a thin solid line), the remnant polarization of the ferroelectric layer 106 is about 16 uC/cm$^2$.

As it may be seen from the graph of FIG. 5, when the ratio of the Zr dopant in the ferroelectric layer 106 including HfO$_2$ is decreased from 50 at % to 30 at %, the remnant polarization decreases. In either case, because the remnant polarization shows a clear hysteresis curve, the ferroelectric layer 106 may operate as a memory cell/memory unit. When using HfO$_2$ as the material of the ferroelectric layer 106 and Zr as the dopant, the ratio of the dopant in the ferroelectric layer 106 may be selected, for example, from 0 at % to about 90 at %. Meanwhile, another material may be used as a dopant instead of Zr, and in this case, a ratio of the dopant in the ferroelectric layer 106 may vary. In the case of using a material other than Zr, such as Si, Al, etc., a ratio of the dopant in the ferroelectric layer 106 may be, for example, in a range from about 0 at % to about 20 at %.

Figure 6:
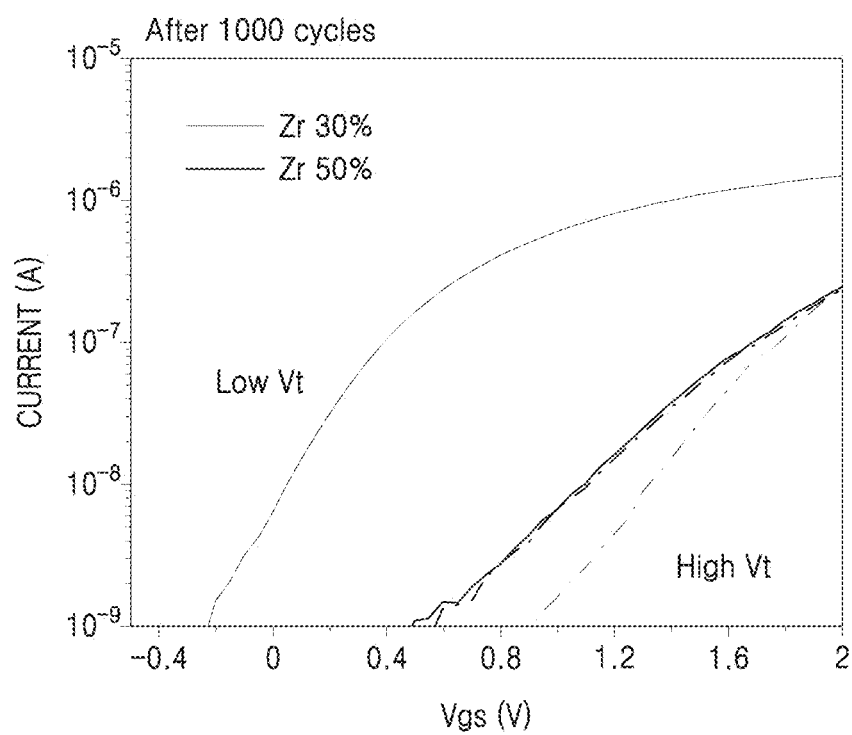
FIG. 6 is a graph showing a comparison of characteristics of two semiconductor devices each including ferroelectric layers having different doping concentrations from each other.

Also, FIG. 6 is a graph showing a comparison of characteristics of two semiconductor devices each including ferroelectric layers having doping concentrations different from each other. HfO$_2$ is used as a material of the ferroelectric layer 106 and Zr is used as a dopant, and the measurement was performed after 1000 set-reset operations/program-erase operations were performed on the ferroelectric layer 106. In addition, in the graph of FIG. 6, Vgs is a gate voltage applied to the gate electrode 107 and the current is a current flowing between the first source/drain region 102 and the second source/drain region 103. Referring to FIG. 6, when the ratio of Zr is 50 at % (indicated by a thick solid line and a dashed line), for example, when a remnant polarization is relatively high, the ferroelectric layer 106 does not operate as a memory after 1000 set-reset operations. On the other hand, when the ratio of Zr is 30 at % (indicated by a thin solid line and a dashed line), for example, when the remnant polarization is relatively low, it may be seen that, even after 1000 set-reset operations, the ferroelectric layer 106 may operate as a memory, e.g. memory cell/memory unit capable of storing one or more bits, and may or may not be non-volatile.

In order to reduce the influence of the interfacial insulating layer 105 in the semiconductor device 100, a thickness of the interfacial insulating layer 105 may be less than that of the ferroelectric layer 106. For example, the thickness of the interfacial insulating layer 105 may be less than or equal to about 2 nm, e.g., in a range from about 0.1 nm to about 2 nm. The thickness of the ferroelectric layer 106 may be, for example, in a range from about 4 nm to about 20 nm. For example, the thickness of the ferroelectric layer 106 may be about 2 to about 200 times the thickness of the interfacial insulating layer 105.

As described above, by appropriately combining the dielectric constant of the interfacial insulating layer 105 and the remnant polarization of the ferroelectric layer 106, the intensity of the electric field applied to the interfacial insulating layer 105 may be reduced. Then, in order to apply an electric field having an intensity equal to or greater than a coercive field to the ferroelectric layer 106, a voltage greater than a breakdown voltage is prevented or reduced in likelihood of occurrence and/or impact from being applied to the interfacial insulating layer 105, thereby preventing or reducing the likelihood of occurrence of and/or impact of the formation of a charge trap in the interfacial insulating layer 105. Accordingly, durability of the semiconductor device 100 may be improved. Alternatively or additionally, because the intensity of the electric field applied to the interfacial insulating layer 205 may be reduced and the intensity of the electric field applied to the ferroelectric layer 206 may be increased, an operating voltage of the semiconductor device 100 may decrease, and power consumption of the semiconductor device 100 may be reduced and operating efficiency of the semiconductor device 100 may be improved. Alternatively or additionally, data retention of the semiconductor device 100 may be improved by reducing a depolarization field.

Figure 7:
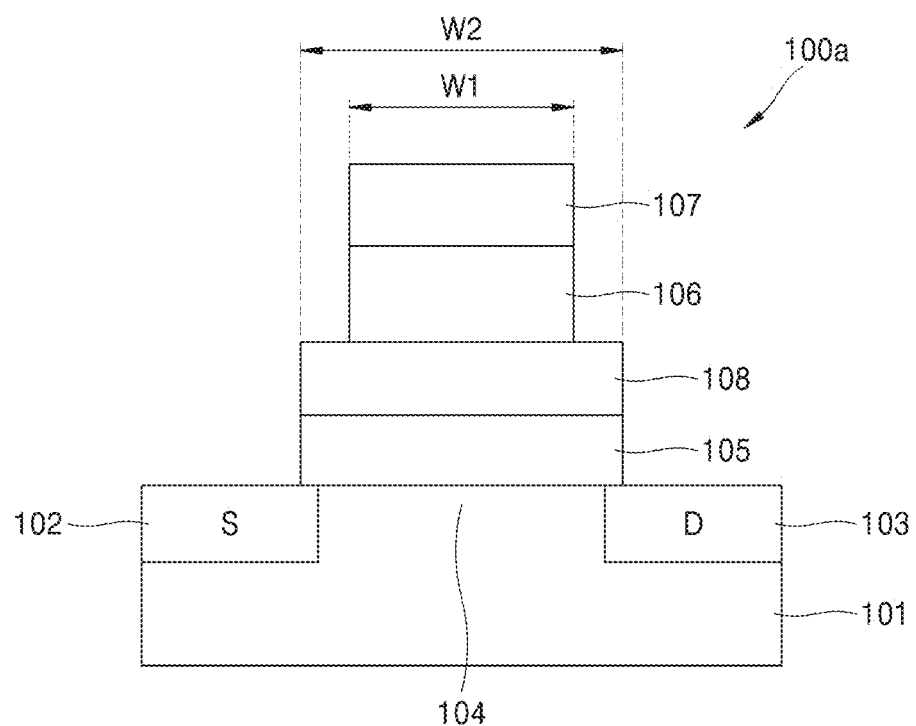
FIG. 7 is a schematic cross-sectional view illustrating a structure of a semiconductor device according to some example embodiments.

FIG. 7 is a schematic cross-sectional view illustrating a structure of a semiconductor device 100a according to some example embodiments. Referring to FIG. 7, the semiconductor device 100a may further include a conductor layer 108 disposed between the interfacial insulating layer 105 and the ferroelectric layer 106. The conductor layer 108 may include, for example, the same conductive material as the gate electrode 107. The conductor layer 108 may be a floating gate to which a voltage is not applied from an external power source.

When the conductor layer 108 is disposed between the interfacial insulating layer 105 and the ferroelectric layer 106, two capacitors connected in series may be formed in the semiconductor device 100a. For example, a lower capacitor may be formed between the channel 104 and the conductor layer 108, and an upper capacitor may be formed between the gate electrode 107 and the conductor layer 108. In the lower capacitor, charges may be accumulated in the interfacial insulating layer 105, and in the upper capacitor, charges may be accumulated in the ferroelectric layer 106. In order to further reduce the intensity of an electric field applied to the interfacial insulating layer 105, the capacitance of the lower capacitor may be increased and/or the capacitance of the upper capacitor may be decreased. To this end, a width or diameter W2 of the interfacial insulating layer 105 and the conductor layer 108 may be greater than a width or diameter W1 of the ferroelectric layer 106 and the gate electrode 107. In other words, a sum of an area of a surface of the interfacial insulating layer 105 that contacts the conductor layer 108 and an area of a surface of the conductor layer 108 that contacts the interfacial insulating layer 105 may be greater than a sum of an area of a surface of the ferroelectric layer 106 that contacts the gate electrode 107 and an area of a surface of the gate electrode 107 that contacts the ferroelectric layer 106. The remaining components of the semiconductor device 100a that are not described may be the same as those of the semiconductor device 100 shown in FIG. 1, and thus, detailed descriptions thereof are omitted.

Figure 8:
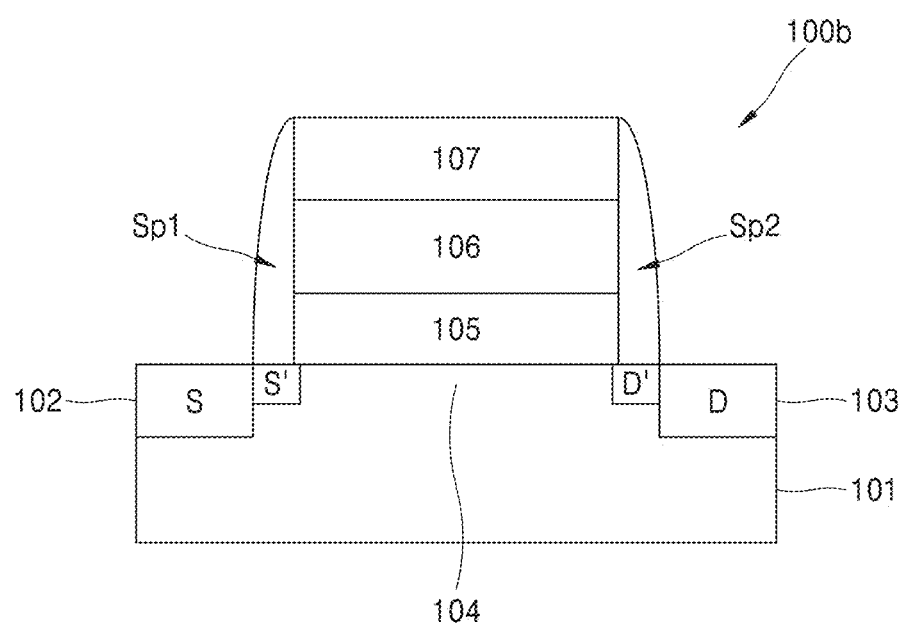
FIG. 8 is a schematic cross-sectional view illustrating a structure of a semiconductor device according to some example embodiments.

FIG. 8 is a schematic cross-sectional view illustrating a structure of a semiconductor device 100b according to some example embodiments. Referring to FIG. 8, the semiconductor device 100b may further include spacers Sp1 and Sp2 that are on a sidewall of the stack including the interfacial insulating layer 105 the ferroelectric layer 106, and the gate electrode 107.

There may be a lightly doped region S' within the substrate 101 adjacent to the first source/drain region 102, and a lightly doped region D' within the substrate 101 adjacent to the second source/drain region 103. The channel 104 may be arranged between the lightly doped region S' and the lightly doped region D'.

A dopant concentration of either or both of the lightly doped region S' and the lightly doped region D' may be lower than the dopant concentration of either or both of the first source/drain region 102 and the second source/drain region 103.

The interfacial insulating layer 105 may be directly on the substrate 101. There may not be another oxide, such as another gate oxide, between the interfacial insulating layer 105 and the substrate 101.

In FIGS. 1, 7 and 8, although the semiconductor devices 100, 100a and 100b are illustrated as field effect transistors having a planar channel 104, example embodiments are not limited thereto. For example, the concept according to the embodiments described above may be applied to a FinFET, a gate-all-around FET (GAAFET), or a multi-bridge channel FET (MBCFET™) having a three-dimensional channel structure.

Figure 9:
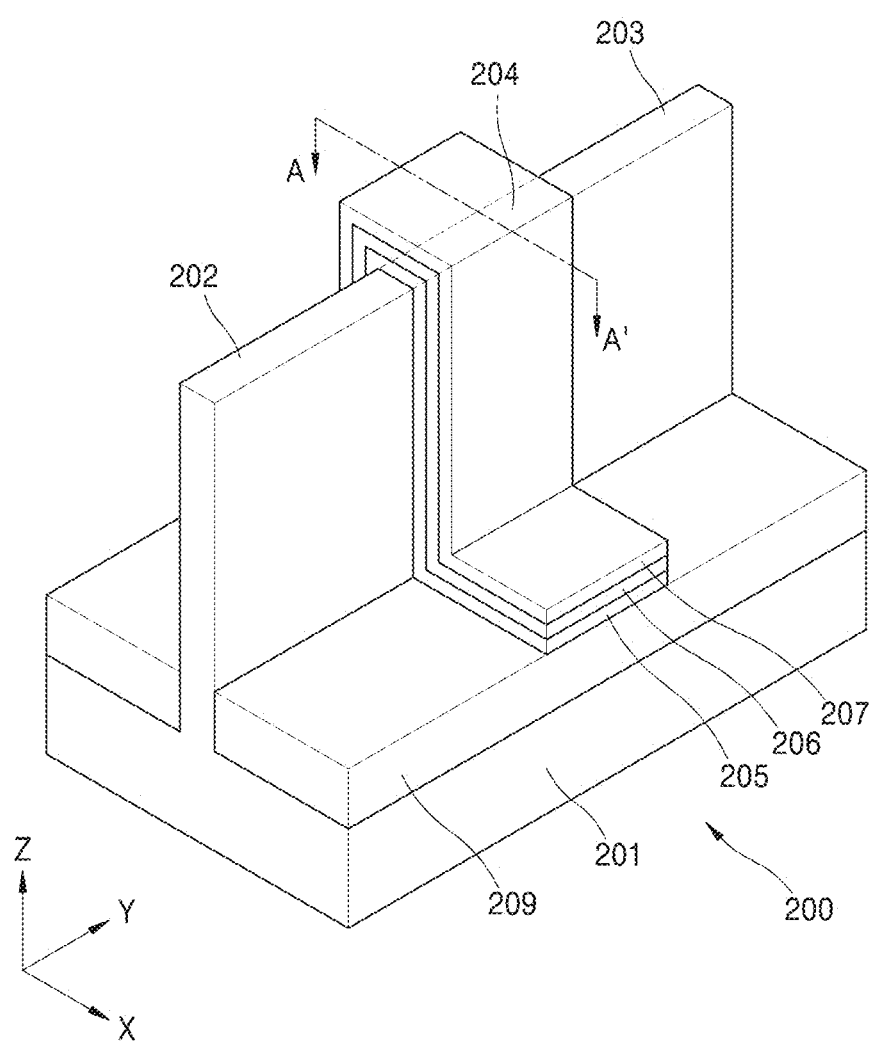
FIG. 9 is a schematic perspective view illustrating a structure of a semiconductor device according to some example embodiments.

FIG. 9 is a schematic cross-sectional view illustrating a structure of a semiconductor device according to some example embodiments. Referring to FIG. 9, the semiconductor device 200 may include a substrate 201, a first source/drain region 202 protruding in a Z-direction from an upper surface of the substrate 201, a second source/drain region 203 protruding in the Z-direction from the upper surface of the substrate 201, a channel 204 protruding from the upper surface of the substrate 201 in the Z-direction and having a bar shape extending in a Y-direction, an interfacial insulating layer 205 surrounding and covering the channel 204, a ferroelectric layer 206 surrounding and covering the interfacial insulating layer 205, and a gate electrode 207 surrounding and covering the ferroelectric layer 206. The semiconductor device 200 may further include a device isolation layer 209 to electrically separate the semiconductor device 200 from other adjacent semiconductor devices (not shown). The device isolation layer 209 may include an insulating dielectric material, and may be disposed to extend in the Y-direction along both sides of the first source/drain region 202, the channel 204, and the second source/drain region 203 on the upper surface of the substrate 201. The semiconductor device 200 shown in FIG. 9 may be or may include, for example, a FinFET.

The channel 204 may extend in the Y-direction to be connected between the first source/drain region 202 and the second source/drain region 203. In other words, a first end of the channel 204 may contact the first source/drain region 202 and a second end of the channel 204 may contact the second source/drain region 203. The channel 204 may include a relatively lightly doped p-type semiconductor or a relatively lightly doped n-type semiconductor.

Figure 10:
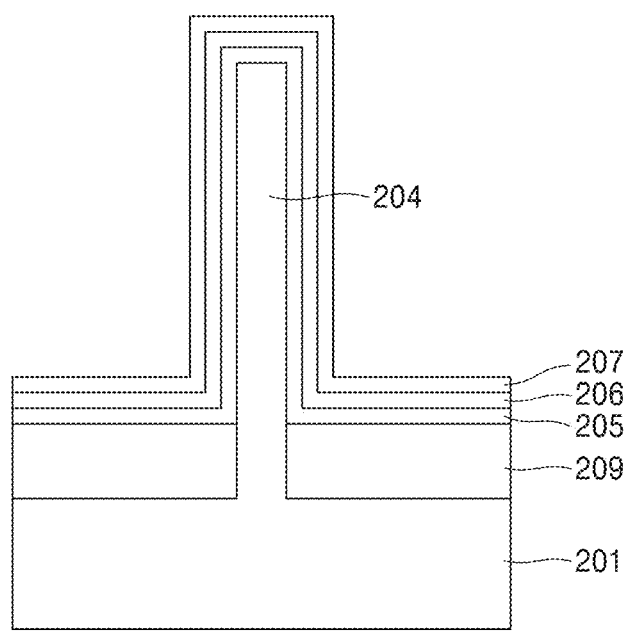
FIG. 10 is a schematic cross-sectional view illustrating a gate structure of the semiconductor device shown in FIG. 9.

FIG. 10 is a schematic cross-sectional view showing a gate structure of the semiconductor device 200 shown in FIG. 9, in particular, a cross-sectional view taken along line A-A' of the gate structure. Referring to FIG. 10, the interfacial insulating layer 205 may be disposed to protrude from an upper surface of the substrate 201 to cover three surfaces of the channel 204, for example, both side surfaces and an upper surfaces of the channel 204. Alternatively or additionally, the ferroelectric layer 206 may be disposed to protrude from the upper surface of the substrate 201 so as to cover three surfaces of the interfacial insulating layer 205, that is, both side surfaces and an upper surface of the interfacial insulating layer 205. The gate electrode 207 may be disposed to protrude from the upper surface of the substrate 201 so as to cover three surfaces of the ferroelectric layer 206, For example, both side surfaces and an upper surface of the ferroelectric layer 206.

FIGS. 9 and 10 show an example in which the semiconductor device 200 is formed by using a bulk semiconductor substrate. In this case, the channel is a central region of an upper portion of the semiconductor substrate remaining after etching both upper regions of the semiconductor substrate. Instead of the bulk substrate, it is also possible to form a semiconductor device on a silicon on insulator (SOI) substrate.

Figure 11:
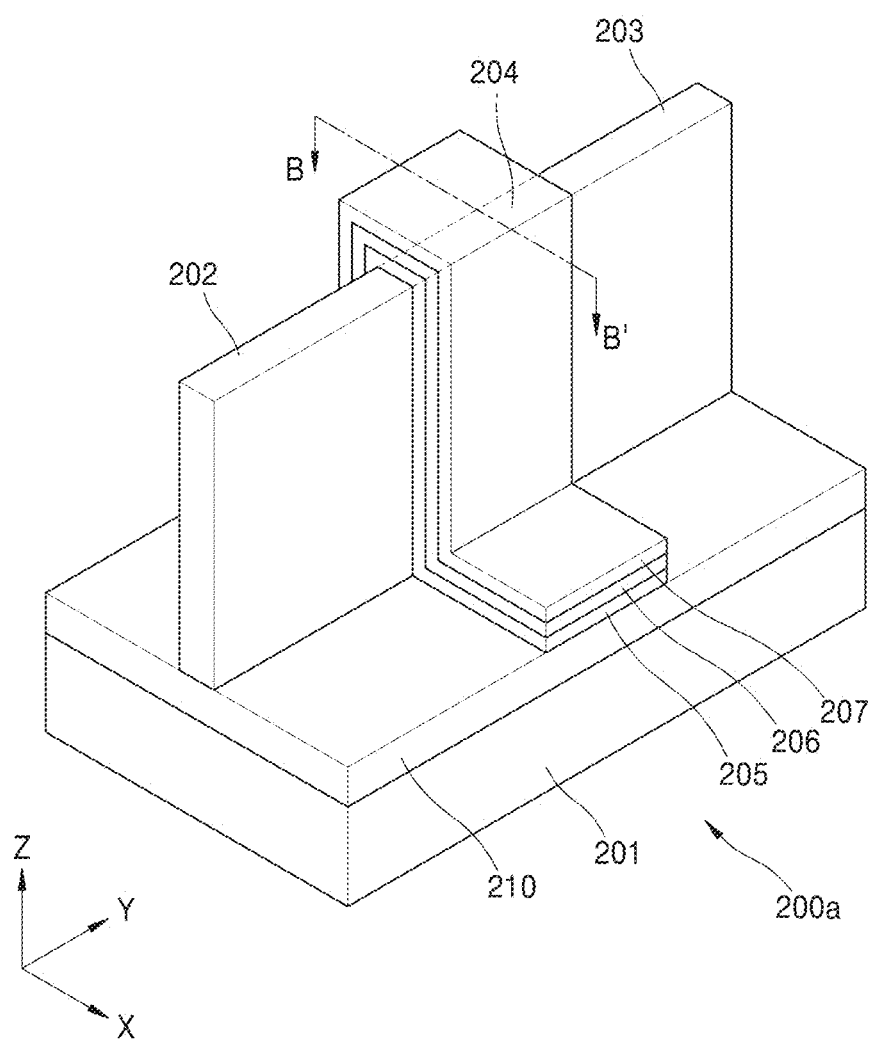
FIG. 11 is a schematic perspective view illustrating a structure of a semiconductor device according to some example embodiments.
Figure 12:
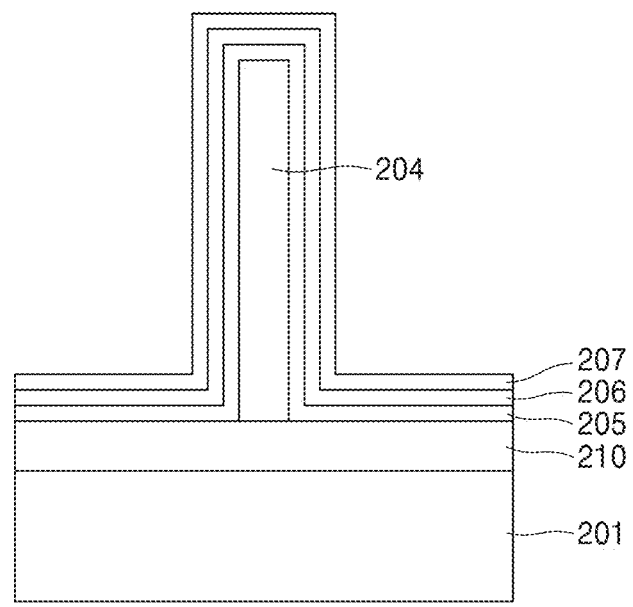
FIG. 12 is a schematic cross-sectional view illustrating a gate structure of the semiconductor device shown in FIG. 11.

FIG. 11 is a schematic perspective view showing a structure of a semiconductor device 200a according to some example embodiments, and FIG. 12 is a schematic cross-sectional view showing a gate structure of the semiconductor device 200a shown in FIG. 11, in particular, a cross-sectional view taken along line B-B' of the gate structure. Referring to FIGS. 11 and 12, the semiconductor device 200a includes a substrate 201, an insulating layer 210 on the substrate 201, a first source/drain region 202 protruding in a Z-direction from an upper surface of the insulating layer 210, a second source/drain region 203 protruding in the Z-direction from the upper surface of the insulating layer 210, a channel 204 protruding in the Z-direction from the upper surface of the insulating layer 210 and having an extended bar shape, an interfacial insulating layer 205 surrounding and covering three side surfaces of the channel 204, a ferroelectric layer 206 surrounding and covering three side surfaces of the interfacial insulating layer 205, and a gate electrode 207 surrounding and covering three side surfaces of the layer 206. The substrate 201 and the insulating layer 210 may form an SOI substrate including silicon and $SiO_2$, respectively. The first source/drain region 202, the second source/drain region 203, and the channel 204 may be formed by depositing on the insulating layer 210, e.g. depositing with at least one of a chemical vapor deposition (CVD) process and an atomic layer deposition (ALD) process.

Figure 13:
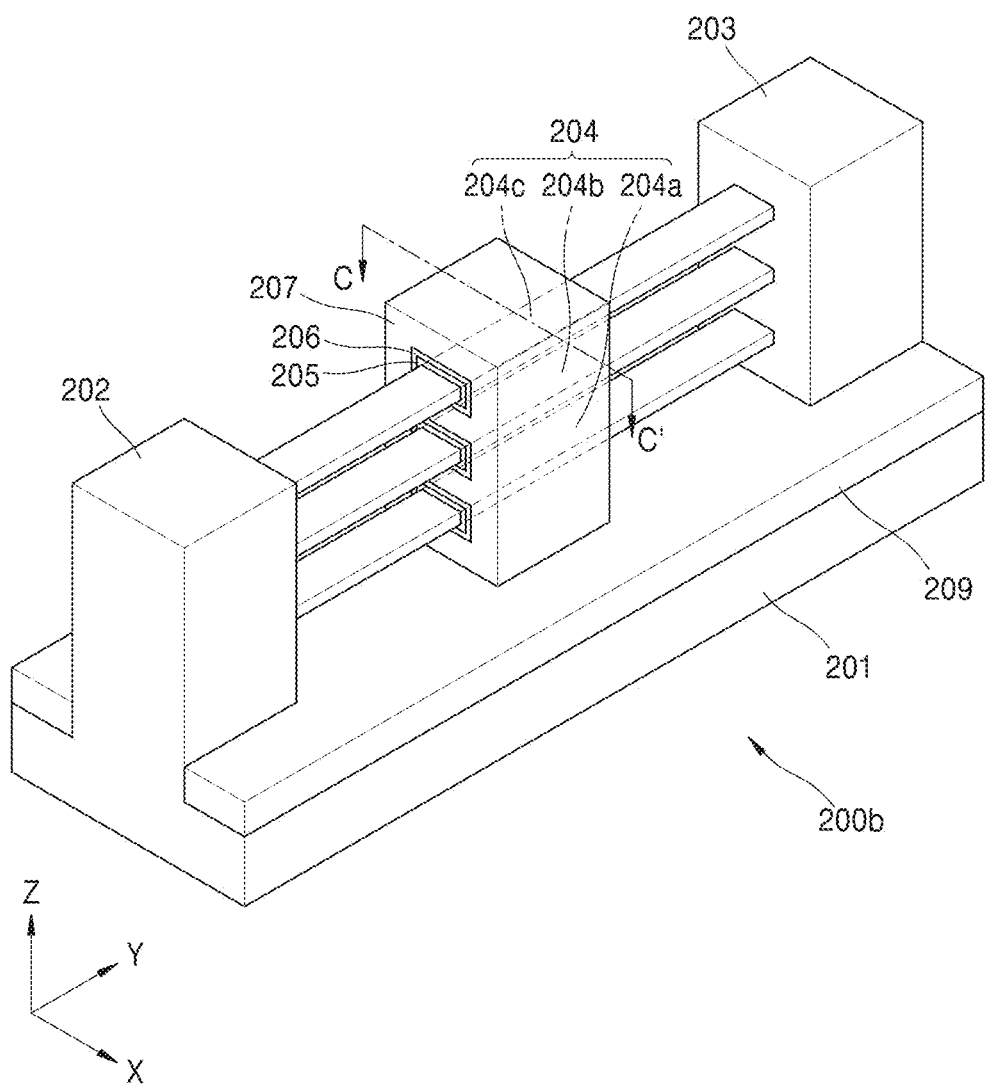
FIG. 13 is a schematic perspective view illustrating a structure of a semiconductor device according to some example embodiments.

FIG. 13 is a schematic cross-sectional view illustrating a structure of a semiconductor device 200b according to some example embodiments. Referring to FIG. 13, the semiconductor device 200b includes a substrate 201, a first source/drain region 202 protruding in the Z-direction from an upper surface of the substrate 201, a second source/drain region 203 protruding in the Z-direction from the upper surface of the substrate 201, a channel 204 separated from the upper surface of the substrate 201 and having a bar shape extending in the Y-direction, an interfacial insulating layer 205 surrounding and covering the channel 204, a ferroelectric layer 206 surrounding and covering the interfacial insulating layer 205, and a gate electrode 207 surrounding and covering the ferroelectric layer 206. The channel 204 may include a plurality of channel elements 204a, 204b, 204c disposed at a distance from each other in the Z-direction or an X direction that is different from the Y-direction. In FIG. 13, although the three channel elements 204a, 204b, and 204c are illustrated as being separated from each other in the Z-direction, this is merely an example and is not necessarily limited thereto. The semiconductor device 200b illustrated in FIG. 13 may be, for example, a GAAFET or an MBCFET™.

Figure 14:
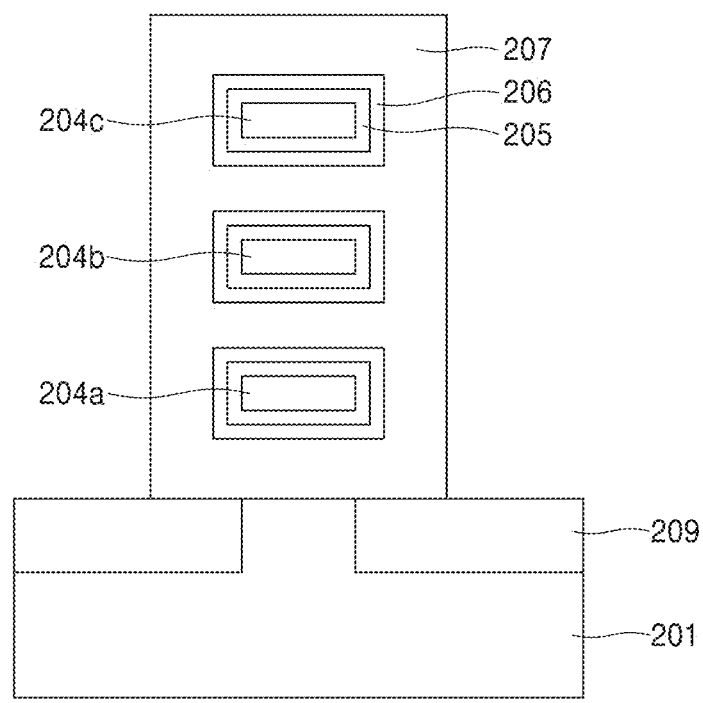
FIG. 14 is a schematic cross-sectional view illustrating a gate structure of the semiconductor device shown in FIG. 13.

FIG. 14 is a schematic cross-sectional view showing a gate structure of the semiconductor device 200b shown in FIG. 13, and in particular, a cross-sectional view taken along line C-C' of the gate structure. Referring to FIG. 14, the semiconductor device 200b may include a plurality of interfacial insulating layers 205 disposed to respectively surround four surfaces of the plurality of channel elements 204a, 204b, and 204c. Also, the semiconductor device 200b may include a plurality of ferroelectric layers 206 disposed to respectively surround four surfaces of the plurality of interfacial insulating layers 205. The gate electrode 207 may have a structure extending in the Z-direction by protruding from an upper surface of the substrate 201 to surround four surfaces of each of the plurality of ferroelectric layers 206.

Principles described with reference to FIGS. 1 to 6 may be applied to the interfacial insulating layer 205 and the ferroelectric layer 206 of the semiconductor devices 200, 200a, and 200b shown in FIGS. 9 to 14.

The semiconductor devices described above may be employed in various electronic apparatuses. For example, the semiconductor devices described above may be used as logic transistors and/or as memory transistors. Alternatively or additionally, the semiconductor devices described above may be used as memory cells. A plurality of memory cells in a two-dimensional arrangement, in a vertical or horizontal direction arrangement, or a one direction arrangement may form a memory cell string. A memory cell array may be formed in a form according to the two-dimensionally disposed memory cell strings. In addition, the semiconductor devices described above may constitute or be included as a part of an electronic circuit that constitutes an electronic apparatus together with other circuit elements, such as a capacitor.

Figure 15:
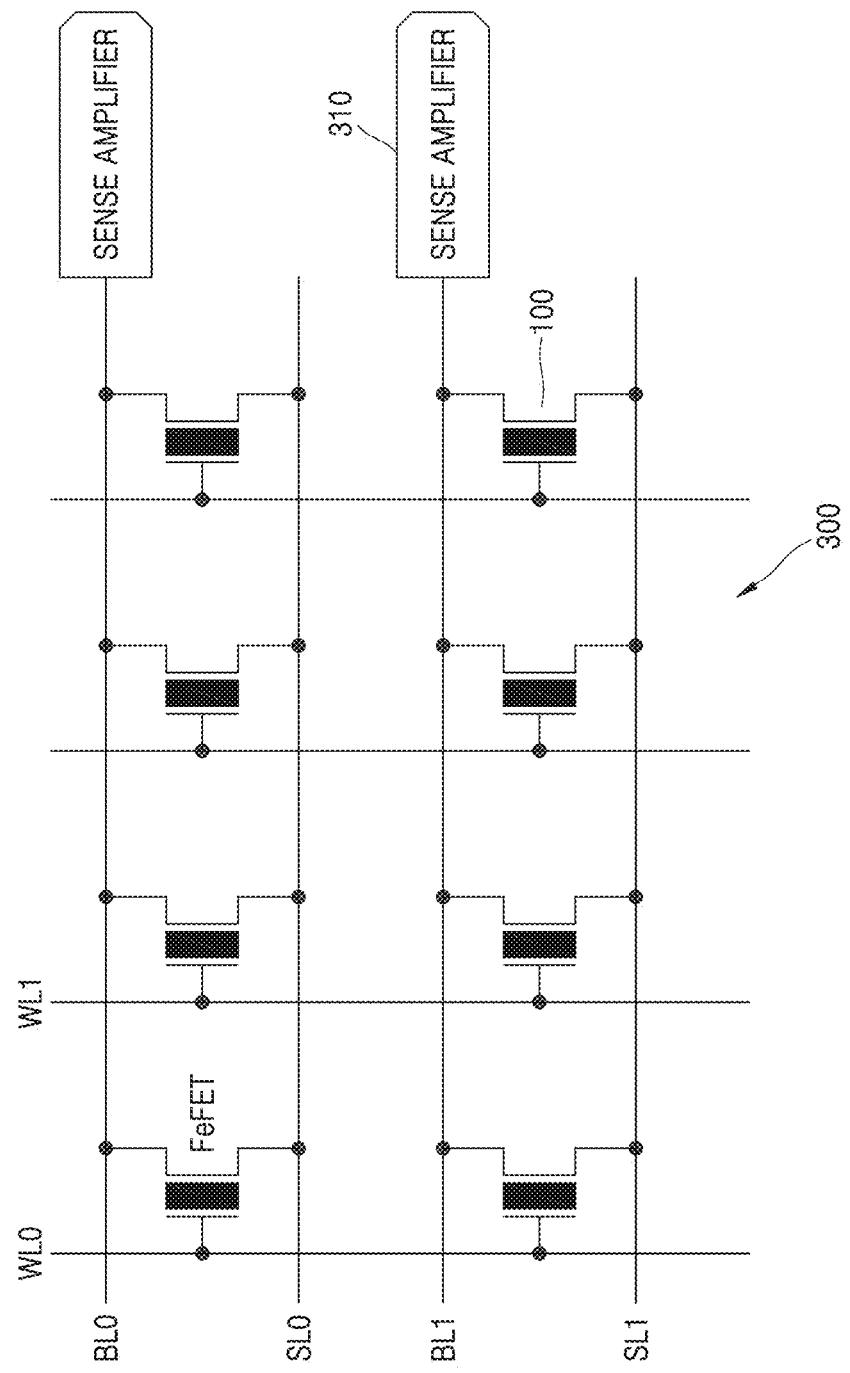
FIG. 15 is a schematic circuit diagram of a memory device including a semiconductor device array.

FIG. 15 is a schematic circuit diagram of a memory device 300 including a semiconductor device array. Referring to FIG. 15, the memory device 300 may include an array of the plurality of semiconductor devices 100 two dimensionally disposed. Also, the memory device 300 may include a plurality of columns/bit lines BL0 and BL1, a plurality of selection lines SL0 and SL1, and a plurality of rows/word lines WL0 and WL1. The selection lines SL0 and SL1 may be electrically connected to a first source/drain region of the semiconductor device 100, the bit lines BL0 and BL1 may be electrically connected to a second source/drain region of the semiconductor device 100, and the plurality of word lines WL0 and WL1 may be electrically connected to a gate electrode of the semiconductor device 100. Also, the memory device 300 may further include an amplifier 310 such as a sense amplifier that is configured to amplify a signal output from the bit lines BL0 and BL1. Each semiconductor device 100 may be one memory cell of the memory device 400.

In FIG. 15, although the memory device 300 is illustrated as a two-dimensional plane for convenience, the memory device 300 may have a stacked structure of two or more layers. For example, a plurality of bit lines BL0 and BL1 and a plurality of selection lines SL0 and SL1 extending in a vertical direction may be two-dimensionally disposed, and a plurality of word lines WL0 and WL1 extending in a horizontal direction may be respectively disposed in a plurality of layers. However, the present inventive concept is not limited thereto, and the memory cells may be three-dimensionally (3D) disposed in various ways.

Figure 16:
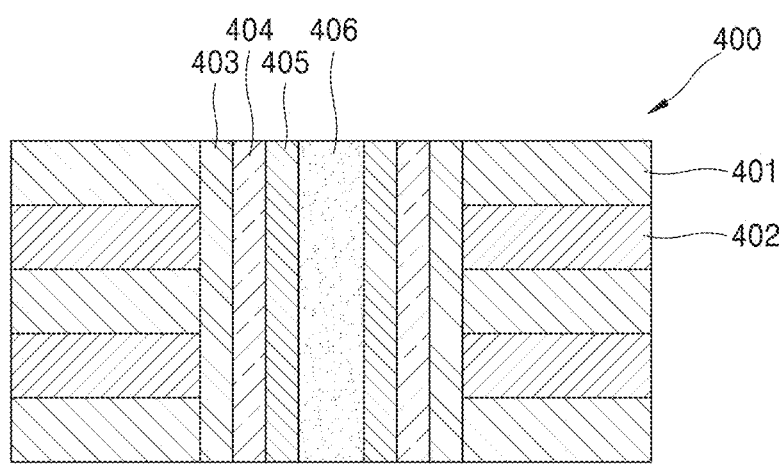
FIG. 16 is a schematic cross-sectional view illustrating a structure of a semiconductor device according to some example embodiments.

FIG. 16 is a schematic cross-sectional view illustrating a structure of a semiconductor device according to some example embodiments. The semiconductor device 400 in FIG. 16 may be a memory cell string of a three-dimensional (or a vertical) NAND (or VNAND) or a three-dimensional FeFET memory. Referring to FIG. 16, the semiconductor device 400 may include a plurality of insulating spacers 401 and a plurality of gate electrodes 402 that are alternately stacked in the vertical direction. The plurality of insulating spacers 401 and the plurality of gate electrodes 402 extend in the horizontal direction. The insulating spacers 401 may include, for example, a silicon oxide, but are not limited thereto. Each of the gate electrodes 402 may be connected to a word line, or each of the gate electrodes 402 may be directly a word line.

Also, the semiconductor device 400 may include a channel hole penetrating the plurality of insulating spacers 401 and the plurality of gate electrodes 402 in the vertical direction. A plurality of layers may be arranged on an inner side of the channel hole. For example, the semiconductor device 400 may include a dielectric filler 406 arranged in a center of the channel hole and extending in the vertical direction, a channel layer 405 surrounding the dielectric filler 406 and extending in the vertical direction, an interfacial insulating layer 404 surrounding the channel layer 405 and extending in the vertical direction, and a ferroelectric layer 403 surrounding the interfacial insulating layer 404 and extending in the vertical direction. The ferroelectric layer 403 may be arranged between the interfacial insulating layer 404 and the plurality of gate electrodes 402. The dielectric filler 406, the channel layer 405, the interfacial insulating layer 404, and the ferroelectric layer 403 may be arranged in a concentric circular shape. Principles described with reference to FIGS. 1 to 6 may be applied to the interfacial insulating layer 404 and the ferroelectric layer 403 of the semiconductor device 400 in FIG. 16.

Figure 17:
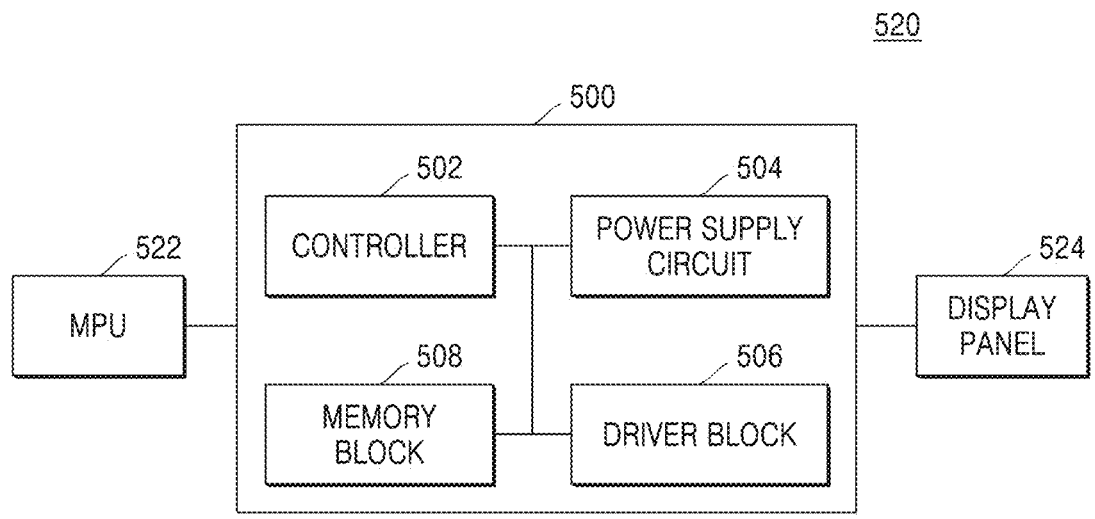
FIG. 17 is a schematic block diagram of a display driver IC (DDI) and a display device including the DDI according to some example embodiments.

FIG. 17 is a schematic block diagram of a display driver IC (DDI) 500 and a display device 520 including the DDI 500 according to some example embodiments. Referring to FIG. 17, the DDI 500 may include a controller 502, a power supply circuit 504, a driver block 506, and a memory block 508. The controller 502 receives and decodes a command applied from a main processing unit (MPU) 522, and controls each block of the DDI 500 to implement an operation in response to the command. The power supply circuit 504 generates a driving voltage in response to control of the controller 502. The driver block 506 drives the display panel 524 by using the driving voltage generated by the power supply circuit 504 in response to the control of the controller 502. The display panel 524 may include, for example, a liquid crystal display panel, an organic light emitting device (OLED) display panel, or a plasma display panel. The memory block 508 is a block for temporarily storing commands input to the controller 502 or control signals output from the controller 502 or for storing necessary data, and may include a memory, such as RAM or ROM. For example, the memory block 508 may include the semiconductor devices according to the embodiments described above.

Figure 18:
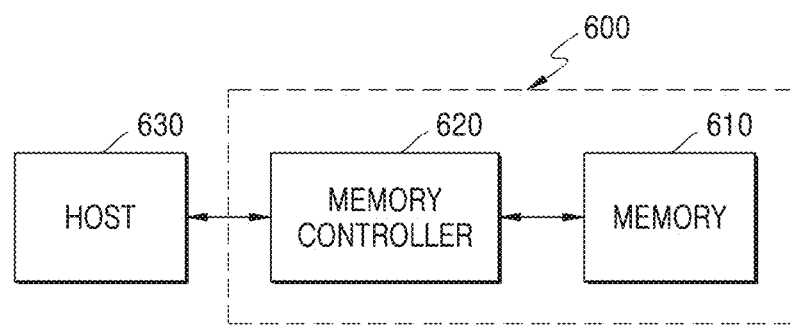
FIG. 18 is a block diagram illustrating an electronic device according to some example embodiments.

FIG. 18 is a block diagram illustrating an electronic apparatus 600 according to some example embodiments. Referring to FIG. 18, the electronic apparatus 600 includes a memory 610 and a memory controller 620. The memory controller 620 may control the memory 610 to read data from and/or write data to the memory 610 in response to a request from a host 630. The memory 610 may include the semiconductor device according to the embodiments described above.

Figure 19:
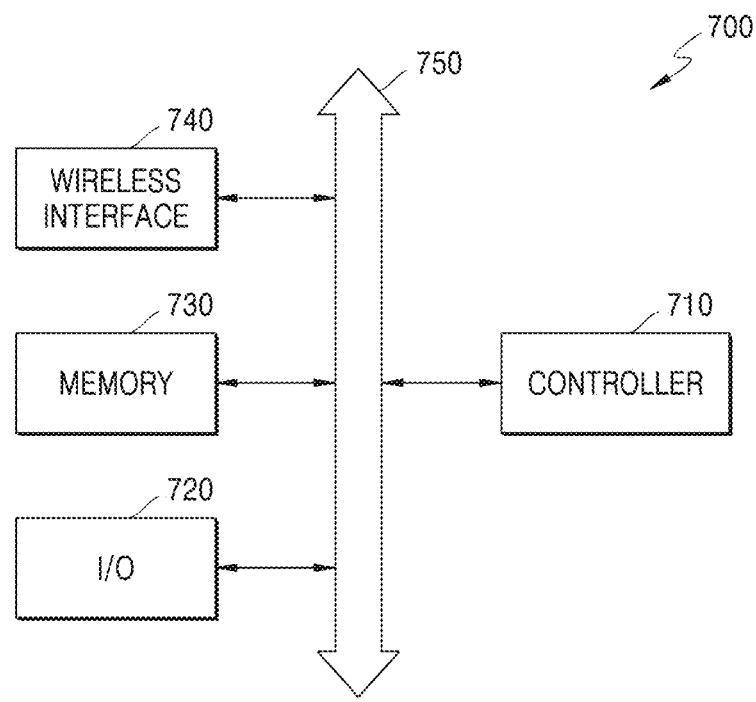
FIG. 19 is a block diagram of an electronic device according to some example embodiments.

FIG. 19 is a block diagram of an electronic apparatus 700 according to some example embodiments. Referring to FIG. 19, an electronic apparatus 700 may constitute a wireless communication device, or a device capable of transmitting and/or receiving information in a wireless environment. The electronic apparatus 700 includes a controller 710, an input/output (I/O) device 720, a memory 730, and a wireless interface 740, which are interconnected through a bus 750.

The controller 710 may include at least one of a microprocessor, a digital signal processor, and a processing apparatus similar thereto. The I/O device 720 may include at least one of a keypad, a keyboard, and a display. The memory 730 may be used to store commands executed by controller 710. For example, the memory 730 may be used to store user data. The electronic apparatus 700 may use the wireless interface 740 to transmit/receive data through a wireless communication network. The wireless interface 740 may include an antenna and/or a wireless transceiver. In some embodiments, the electronic apparatus 700 may be used for a communication interface protocol of a third generation communication system, for example, one or more of a code division multiple access (CDMA), a global system for mobile communications (GSM), a north American digital cellular (NADC), an extended-time division multiple access (E-TDMA), and/or a wide band code division multiple access (WCDMA). The memory 730 of the electronic apparatus 700 may include the semiconductor device according to the embodiments described above.

Figure 20:
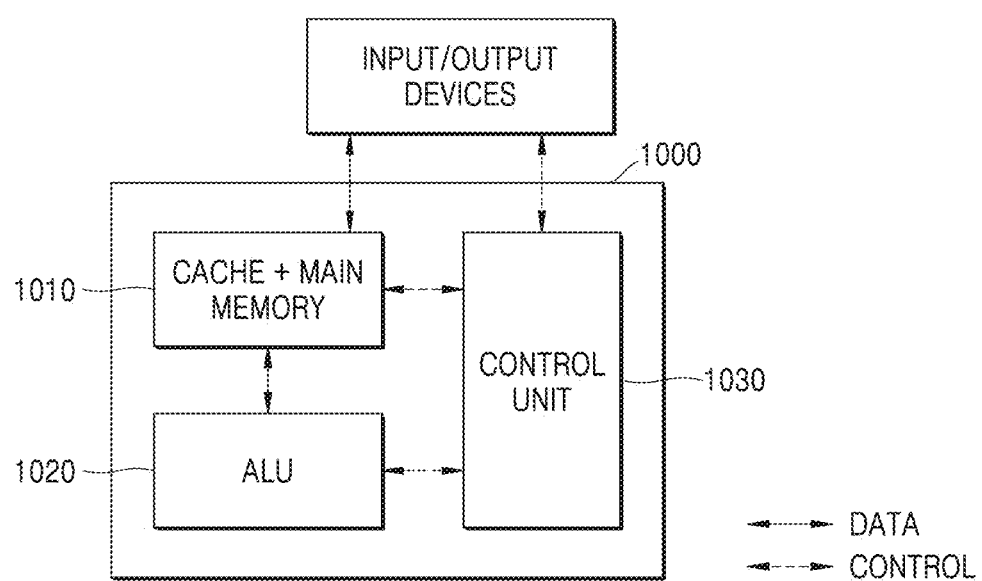
FIGS. 20 and 21 are schematic conceptual diagrams illustrating a device architecture applicable to an electronic device according to some example embodiments.
Figure 21:
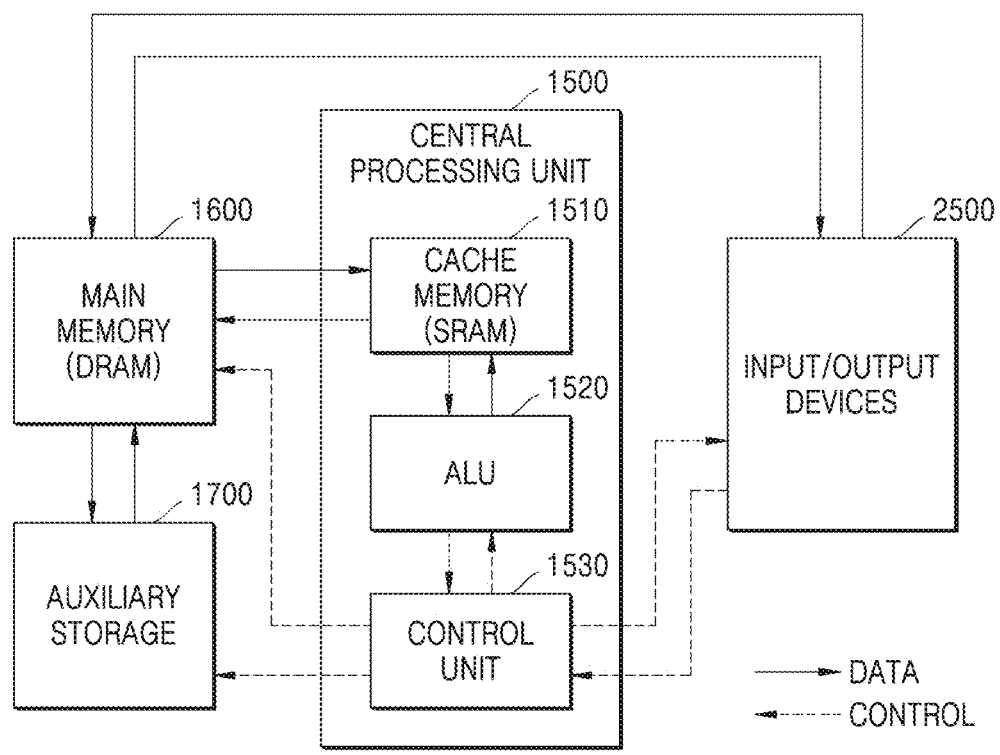

FIGS. 20 and 21 are schematic conceptual diagrams illustrating a device architecture applicable to an electronic apparatus according to some example embodiments.

Referring to FIG. 20, an electronic device architecture 1000 may include a memory unit 1010 and a control unit 1030, and may further include an arithmetic logic unit (ALU) (1020). The memory unit 1010, the ALU 1020, and the control unit 1030 may be electrically connected to each other. For example, the electronic device architecture 1000 may be implemented as one chip including the memory unit 1010, the ALU 1020, and the control unit 1030. Specifically, the memory unit 1010, the ALU 1020, and the control unit 1030 may be interconnected through a metal line in an on-chip to directly communicate with each other. The memory unit 1010, the ALU 1020, and the control unit 1030 may be monolithically integrated on one substrate to constitute one chip. An I/O device 2000 may be connected to the electronic device architecture (chip) 1000. Also, the memory unit 1010 may include both a main memory and a cache memory. The electronic device architecture (chip) 1000 may be an on-chip memory processing unit. The memory unit 1010, the ALU 1020, and/or the control unit 1030 may each independently include the semiconductor device according to the embodiments described above.

Referring to FIG. 21, a cache memory 1510, an ALU 1520, and a control unit 1530 may constitute a central processing unit (CPU) 1500, and the cache memory 1510 may include a static random access memory (SRAM). Separately from the CPU 1500, a main memory 1600 and an auxiliary storage 1700 may be provided, and an I/O device 2500 may be provided. The main memory 1600 may be, for example, a dynamic random access memory (DRAM) and may include the semiconductor device according to the embodiments described above.

In some cases, an electronic device architecture may be implemented in a form in which computing unit devices and memory unit devices are adjacent to each other in a single chip without distinction of sub-units.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that various example embodiments described herein should be considered in a descriptive sense only and not for purposes of limitation. Descriptions of features or aspects within each embodiment and/or figure should typically be considered as available for other similar features or aspects in other embodiments and/or figure, and example embodiments are not necessarily mutually exclusive with one another. While one or more embodiments have been described with reference to the figures, it will be understood by those of ordinary skill in the art that various changes in form and/or details may be made therein without departing from the spirit and scope as defined by the following claims.

What is claimed is:

1. A semiconductor device comprising:
a first source/drain region;
a second source/drain region;
a channel between the first source/drain region and the second source/drain region;
an interfacial insulating layer on the channel;
a ferroelectric layer on the interfacial insulating layer; and
a gate electrode on the ferroelectric layer,
wherein the interfacial insulating layer includes at least one material selected from M-Si$_x$Ge$_{1-x}$—O (0≤x≤1) and M-Si$_x$Ge$_{1-x}$—O$_y$N$_{1-y}$ (0≤x≤1, 0≤y≤1), where M includes a metal material.

2. The semiconductor device of claim 1, wherein the dielectric constant of the interfacial insulating layer and the remnant polarization of the ferroelectric layer are such that a voltage applied to the interfacial insulating layer during application of an operating voltage to the gate electrode is less than a breakdown voltage of the interfacial insulating layer.

3. The semiconductor device of claim 1, wherein the dielectric constant of the interfacial insulating layer is 22 or more, and the remnant polarization of the ferroelectric layer is 0.1 uC/cm$^2$ or more and 15 uC/cm$^2$ or less.

4. The semiconductor device of claim 1, wherein the dielectric constant of the interfacial insulating layer is 14 or more, and the remnant polarization of the ferroelectric layer is greater than or equal to 0.1 uC/cm$^2$ and less than or equal to 10 uC/cm$^2$.

5. The semiconductor device of claim 1, wherein the dielectric constant of the interfacial insulating layer is 7 or more, and the remnant polarization of the ferroelectric layer is greater than or equal to 0.1 uC/cm$^2$ and less than or equal to 5 uC/cm$^2$.

6. The semiconductor device of claim 1, wherein a coercive field of the ferroelectric layer is in a range from about 30 kV/cm to about 3 MV/cm or less.

7. The semiconductor device of claim 1, wherein the metal material includes at least one material selected from Ti, Al, Hf, Zr, La, Y, Mg, and Be or a combination thereof.

8. The semiconductor device of claim 1, wherein the ferroelectric layer includes an oxide selected from the group including silicon oxide, hafnium oxide, and zirconium oxide, or the ferroelectric layer includes a two-dimensional ferroelectric material.

9. The semiconductor device of claim 8, wherein the ferroelectric layer further includes a dopant doped in the oxide or the two-dimensional ferroelectric material, wherein the dopant includes at least one material selected from the group including Si, Al, Y, La, Gd, Mg, Ca, Sr, Ba, Ti, Zr, Hf and N.

10. The semiconductor device of claim 9, wherein the ferroelectric layer includes at least two dopants different from each other.

11. The semiconductor device of claim 9, wherein a ratio of the dopant in the ferroelectric layer is in a range from about 0 at % to about 90 at %.

12. The semiconductor device of claim 8, wherein the two-dimensional ferroelectric material includes at least one material selected from the group including 1T-MoS$_2$, SnTe, GeSe, 1T-MoTe$_2$, In$_2$Se$_3$, and CuInP$_2$S$_6$.

13. The semiconductor device of claim 1, further comprising:
a conductor layer between the interfacial insulating layer and the ferroelectric layer.

14. The semiconductor device of claim 13, wherein a sum of an area of a surface of the interfacial insulating layer in contact with the conductor layer and an area of a surface of the conductor layer in contact with the interfacial insulating layer is greater than a sum of an area of a surface of the ferroelectric layer in contact with the gate electrode and an area of a surface of the gate electrode in contact with the ferroelectric layer.

15. The semiconductor device of claim 1, further comprising:
a substrate,
wherein the channel protrudes from an upper surface of the substrate and has a shape extending in a first direction.

16. The semiconductor device of claim 15, wherein the interfacial insulating layer surrounds side surfaces and an upper surface of the channel,
the ferroelectric layer surrounds side surfaces and an upper surface of the interfacial insulating layer, and
the gate electrode surrounds side surfaces and an upper surface of the ferroelectric layer.

17. The semiconductor device of claim 1, further comprising:
a substrate,
wherein the channel is separate from an upper surface of the substrate and extends in a first direction.

18. The semiconductor device of claim 16, wherein the channel includes a plurality of channel elements at a distance from each other in a second direction that is different from the first direction.

19. The semiconductor device of claim 18, wherein the interfacial insulating layer includes a plurality of interfacial insulating layers to respectively surround the plurality of channel elements, the ferroelectric layer includes a plurality of ferroelectric layers to respectively surround the plurality of interfacial insulating layers, and the gate electrode protrudes from the upper surface of the substrate to surround the plurality of ferroelectric layers.

20. A semiconductor device comprising:
a first source/drain region;
a second source/drain region;
a channel between the first source/drain region and the second source/drain region;
an interfacial insulating layer on the channel;
a ferroelectric layer on the interfacial insulating layer; and
a gate electrode on the ferroelectric layer,
wherein the interfacial insulating layer includes at least one material selected from the group including M-Si$_x$Ge$_{1-x}$—O ($0 \leq x \leq 1$) and M-Si$_x$Ge$_{1-x}$—O$_y$N$_{1-y}$ ($0 \leq x \leq 1$, $0 \leq y \leq 1$), where M includes a metal material, and a coercive field of the ferroelectric layer is in a range from about 30 kV/cm to about 3 MV/cm or less.

21. The semiconductor device of claim 20, wherein, a first material of the interfacial insulating layer and a second material of the ferroelectric layer are selected so that K/Pr is 1 or more, where K is a numerical value of a dielectric constant of the interfacial insulating layer and Pr is a numerical value in uC/cm² of a remnant polarization of the ferroelectric layer.

22. The semiconductor device of claim 21, wherein the dielectric constant of the interfacial insulating layer is 22 or more, and the remnant polarization of the ferroelectric layer is 0.1 uC/cm² or more and 15 uC/cm² or less.

23. The semiconductor device of claim 21, wherein the dielectric constant of the interfacial insulating layer is 14 or more, and the remnant polarization of the ferroelectric layer is greater than or equal to 0.1 uC/cm² and less than or equal to 10 uC/cm².

24. The semiconductor device of claim 21, wherein the dielectric constant of the interfacial insulating layer is 7 or more, and the remnant polarization of the ferroelectric layer is greater than or equal to 0.1 uC/cm² and less than or equal to 5 uC/cm².

25. An electronic apparatus comprising at least one semiconductor device,
wherein each semiconductor device includes:
a first source/drain region;
a second source/drain region;
a channel between the first source/drain region and the second source/drain region;
an interfacial insulating layer on the channel;
a ferroelectric layer on the interfacial insulating layer; and
a gate electrode on the ferroelectric layer,
wherein the interfacial insulating layer includes at least one material selected from M-Si$_x$Ge$_{1-x}$—O ($0 \leq x \leq 1$) and M-Si$_x$Ge$_{1-x}$—O$_y$N$_{1-y}$ ($0 \leq x \leq 1$, $0 \leq y \leq 1$), where M includes a metal material.

26. The semiconductor device of claim 1, wherein the interfacial insulating layer is directly on the channel layer.

* * * * *